United States Patent
Hirose

(10) Patent No.: US 9,402,317 B2
(45) Date of Patent: Jul. 26, 2016

(54) ASHING APPARATUS

(71) Applicant: USHIO DENKI KABUSHIKI KAISHA, Tokyo (JP)

(72) Inventor: Kenichi Hirose, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/896,016

(22) PCT Filed: May 26, 2014

(86) PCT No.: PCT/JP2014/063844
§ 371 (c)(1),
(2) Date: Dec. 4, 2015

(87) PCT Pub. No.: WO2014/199808
PCT Pub. Date: Dec. 18, 2014

(65) Prior Publication Data
US 2016/0128200 A1 May 5, 2016

(30) Foreign Application Priority Data
Jun. 10, 2013 (JP) ................................. 2013-121816

(51) Int. Cl.
| G21K 5/00 | (2006.01) |
| H05K 3/00 | (2006.01) |
| H01L 21/67 | (2006.01) |

(52) U.S. Cl.
CPC ........ *H05K 3/0055* (2013.01); *H01L 21/67115* (2013.01)

(58) Field of Classification Search
USPC ................ 250/492.1, 492.2, 492.21, 492.22, 250/492.23, 493.1, 494.1, 504 R
See application file for complete search history.

(56) References Cited

U.S. PATENT DOCUMENTS

| 2006/0201018 A1* | 9/2006 | McKay | F26B 3/28 34/276 |
| 2008/0252865 A1* | 10/2008 | Nagasaka | G03F 7/70341 355/30 |
| 2008/0289650 A1* | 11/2008 | Arena | B08B 7/0057 134/1.2 |

(Continued)

FOREIGN PATENT DOCUMENTS

| JP | S60-116231 A | 8/1985 |
| JP | S63-020833 A | 1/1988 |

(Continued)

OTHER PUBLICATIONS

International Search Report issued in Application No. PCT/JP2014/063844, mailed Aug. 26, 2014.

(Continued)

*Primary Examiner* — Nicole Ippolito
(74) *Attorney, Agent, or Firm* — Studebaker & Brackett PC

(57) ABSTRACT

An ashing apparatus includes a treatment chamber having an object to be processed therein, and a lamp chamber having an ultraviolet lamp that radiates the object with an ultraviolet beam. The ashing apparatus is configured to accurately maintain an irradiation distance between a light source and the object. Thus, it is possible to efficiently remove a smear from a wiring board. The treatment chamber and the lamp chamber are moved relative to each other and in parallel to a surface of the object to be processed. The treatment chamber has a stage that supports the object, a gas inlet opening for supplying a treatment gas into the treatment chamber, and a gas outlet opening for discharging the treatment gas. An ultraviolet transmitting window member that partitions the treatment chamber and the lamp chamber from each other is fixed to the treatment chamber.

7 Claims, 5 Drawing Sheets

(56) References Cited

U.S. PATENT DOCUMENTS

2013/0344704 A1* 12/2013 Chhabra ................. C23C 14/00 438/778
2015/0062545 A1* 3/2015 Muramatsu ......... H01L 21/6715 355/30

FOREIGN PATENT DOCUMENTS

| JP | H64-081318 A | 3/1989 |
| JP | H04-184928 A | 7/1992 |
| JP | H05-109674 A | 4/1993 |
| JP | 2007-227496 A | 9/2007 |
| JP | 2010-205801 A | 9/2010 |
| JP | 2011-181535 A | 9/2011 |

OTHER PUBLICATIONS

Japanese Office Action issued in Application No. 2013-121816, dated Jan. 28, 2015.

* cited by examiner

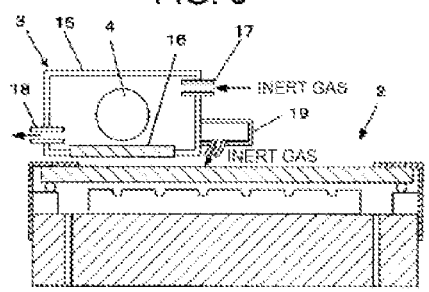

ASHING APPARATUS

TECHNICAL FIELD

The present invention relates to an ashing apparatus that uses an ultraviolet lamp to remove smear from a surface of a substrate. In particular, the present invention relates to an ashing apparatus that is suitable for treating the smear, which is made from an organic residue remaining on the substrate in a process of manufacturing a wiring substrate or the like.

BACKGROUND ART

A multi-layer wiring substrate is known as a substrate to have semiconductor elements, such as a semiconductor IC circuits or the like, thereon. The multi-layer wiring substrate includes insulating layers and wiring conductors, which are stacked one over another.

A build-up method is known as a method of manufacturing such multi-layer wiring substrate. The resulting multi-layer wiring substrate has a lower insulating layer, a lower conductor layer (wiring conductor) formed on the lower insulating layer, an upper insulating layer formed on the lower insulating layer and the lower conductor layer, and an upper conductor layer (wiring conductor) formed on the upper insulating layer. Via holes are formed in the upper insulating layer such that the via holes extend downward to the lower wiring conductor. Part of the upper wiring conductor is applied on the interior of each via hole to connect the upper wiring conductor to the lower wiring conductor. Such technique is disclosed in, for example, Japanese Patent Application Laid-Open Publication No. 2010-205801 (Patent Literature Document 1).

FIGS. 6(A) to 6(C) of the accompanying drawings show part of a method of manufacturing a multi-layer wiring substrate, which is disclosed in Patent Literature Document 1.

(A) An upper insulating layer 33 is formed on top of a lower insulating layer 31. A wiring conductor 32 is also formed on the lower insulating layer 31.

(B) Part of the upper insulating layer 33 is removed by, for example, a laser beam or a drill to create a via hole 34. In this process, smear S that is derived from the material of the upper insulating layer 33 inevitably remains.

(C) In order to remove the smear S, a desmear process (smear removing process) is applied such that the smear is dissolved with, for example, an alkaline solution. Then, an upper surface of the wiring conductor 32 is exposed.

In this manner, the dissolving process with the alkaline solution is needed to remove the smear S on the upper insulation layer 33. This process is in fact irrelevant to the method of manufacturing the substrate itself, and entails a wet process to be applied to the entire substrate. Thus, there is a problem, i.e., a throughput is not good.

To avoid such problems, the conventional wet method that relies upon the alkaline solution is not used in the desmear treatment during the substrate manufacturing process. Instead, a dry method (dry process) is recently studied, i.e., a method of removing the smear with an ashing treatment is studied.

There is another problem. Specifically, a high cost is needed to treat a high-density alkaline waste solution that results after the method using the alkaline solution is performed, and a high cost is needed to treat a low-density alkaline waste solution that results after a subsequent rinsing process or the like.

One of the recently studied dry methods that use the ashing process includes placing a substrate (object to be treated) in an atmosphere containing oxygen, and irradiating the object with an ultraviolet beam at a wavelength of 200 nm or shorter (vacuum ultraviolet beam) to decompose and remove an organic substance. If the desmear treatment is carried out by the dry method in the above-described manner, the rinsing process and the drying process become unnecessary. Note that the rising process and the drying process are necessary after the desmear treatment, if the desmear treatment is carried out by the wet method. Also, if the desmear treatment is carried out by the dry method, there is no waste solution, and it is possible to smoothly proceed to a next process. This can significantly reduce the manufacturing cost.

Such ashing apparatus is disclosed in, for example, Japanese Patent Application Laid-Open Publication No. 2007-227496 (Patent Literature Document 2) and Japanese Patent Application Laid-Open Publication No. 2011-181535 (Patent Literature Document 3). These patent literature documents teach an ashing apparatus that includes a lamp for emitting an ultraviolet beam, and irradiates a work with a beam (vacuum ultraviolet light) through a quartz glass window.

The ashing apparatus disclosed in Patent Literature Document 2 includes a protecting tube and an ultraviolet lamp received in the protecting tube. A work is placed in a chamber, and the ashing treatment is applied to the entire sheet of work. The ashing apparatus of this Patent Literature Document performs the ventilation while introducing an inert gas into the chamber during the ashing treatment, or only performs the ventilation of the chamber during the ashing treatment.

LISTING OF REFERENCES

Patent Literature Documents

PATENT LITERATURE DOCUMENT 1: Japanese Patent Application Laid-Open Publication No. 2010-205801
PATENT LITERATURE DOCUMENT 2: Japanese Patent Application Laid-Open Publication No. 2007-227496
PATENT LITERATURE DOCUMENT 3: Japanese Patent Application Laid-Open Publication No. 2011-181535

SUMMARY OF THE INVENTION

Problems to be Solved by the Invention

When the smear produced in the above-described process of manufacturing the wiring substrate or the like should be removed, an insulating layer having the same component (constituent) as the smear is present on the surface of the wiring substrate. If the wiring substrate is irradiated with the ultraviolet beam for a long time in order to thoroughly perform the removing treatment to the smear, then a problem arises, i.e., the insulating layer which should not be decomposed is decomposed. When the insulating layer is excessively decomposed, and loses the insulation property, the wiring substrate cannot function as the wiring substrate. On the other hand, if the wiring substrate is irradiated with an insufficient amount of ultraviolet beam in order to protect the insulating layer, the smear is not removed completely, and the conduction of the wiring conductor through the via holes becomes insufficient.

When the ashing treatment is applied to the wiring substrate having the insulating layer as described above, the insulating layer is an indispensable element for the final product, unlike a resist used in a process of manufacturing a semiconductor substrate. The resist used in the process of manufacturing a semiconductor substrate is temporarily provided, and completely removed in a subsequent process. The resist is a transient organic substance. On the other hand, when the ashing treatment is applied to the wiring substrate having the insulating layer, it is important to avoid the adverse influence on the insulating layer when treating the smear. Thus, if the wiring substrate includes a mixture of an insulating layer that should remain as an indispensable element, and smear that is derived from the insulating layer, then the ashing treatment should not be applied for a long time. This is different from a conventional ashing treatment. Thus, a conventional apparatus and a conventional process cannot be applied straightforward to the wiring substrate, if the wiring substrate includes a mixture of an insulating layer that should remain as an indispensable element, and smear that is derived from the insulating layer.

In order to cope with such unique problem, the radiation distance (light travelling distance) between the light source and the object to be treated may be reduced. It is known that the reduced radiation distance can enhance the capability of the ultraviolet beam to treat the ozone (ashing capability). It is also known that when the radiation distance is reduced to a certain value (3 mm or shorter) and the concentration of oxygen, for example, in the treatment gas is increased to a certain value (50% or higher), then the treatment capability of the ultraviolet beam is further enhanced.

Thus, it is required to precisely control the concentration of the treatment gas, reduce the distance between the light source and the object to be treated, and set the irradiation time to a short time.

Although the ashing apparatus of Patent Literature Document 2, which performs an ashing treatment to the entire work at once, can fix (maintain) the distance between the light source and the object to be treated, it is necessary to change the atmosphere (treatment gas) inside the chamber every time a new substrate is placed in the chamber. Because of the work replacement and the treatment gas replacement, the ashing apparatus of Patent Literature Document 2 suffers from a problem of low productivity.

If the object to be treated (work) and the lamp (or the lamp chamber) are moved relative to each other in the scanning movement while the object (work) is irradiated with the ultraviolet beam, as in the ashing apparatus of Patent Literature Document 3, then the lamp or the lamp chamber may collide with the object because the object has a bending or curving portion on its surface. Thus, there is a problem, i.e., it is not possible to move the lamp close to the work and irradiate the work with the light.

When a work scan method that uses conveyance rollers is employed to convey the work, the work may jump during the conveyance. Thus, it is difficult to reduce the distance (radiation distance) between the light source (window) and the work surface to 3 mm or less than 3 mm. For example, the work may contact the light emitting device and/or the irradiation window, and a problem such as scratching may occur. If the work has a thin thickness (e.g., 0.1 to 3 mm) and is a thin flat (planar) printed circuit board or printed wiring board, then the work bends between a front roller and a rear roller. Then, the work may become stuck and/or the radiation distance may increase. The work may be even damaged. As such, appropriate UV ozone treatment cannot be expected in a certain case. When the distance between the work and the light source (window) changes, there is a problem, i.e., the treatment is not carried out uniformly, and the entire work is not treated uniformly.

In consideration of the above-described problems of the prior art, an object of the present invention is to provide an ashing apparatus that can accurately maintain a radiation distance (light travelling distance) between a light source and an object to be treated, and can be moved in a reliable manner. The ashing apparatus includes a treatment chamber, in which the object to be treated is placed, and a lamp chamber, in which a ultraviolet lamp for irradiating the object with a ultraviolet beam, is disposed. In other words, an object of the invention is to provide an ashing apparatus that can remove a substance, which should be removed from the object, in a reliable and efficient manner.

Solution to the Problems

In order to overcome the above-mentioned problems, an ashing device of the present invention includes a treatment chamber and a lamp chamber, and the treatment chamber and the lamp chamber are moved relative to each other and in parallel to a target surface of an object to be treated (processed). The target surface is a surface to be treated. The treatment chamber has a stage to support the object to be treated. The treatment chamber also has a gas inlet opening to supply a treatment gas (processing gas) into the treatment chamber, and a gas outlet opening to discharge the treatment gas. A window member, which transmits an ultraviolet beam therethrough, is secured to the treatment chamber. The window member partitions the treatment chamber and the lamp chamber.

The lamp chamber and the treatment chamber may be moved relative to each other along (in parallel to) the flowing direction of the treatment gas in the treatment chamber.

The lamp chamber and the treatment chamber may be moved relative to each other in a direction opposite the flowing direction of the treatment gas in the treatment chamber.

The lamp chamber and the treatment chamber may be moved relative to each other in the same direction as the flowing direction of the treatment gas in the treatment chamber. A speed of the relative movement between the lamp chamber and the treatment chamber may be slower than a flowing speed of the treatment gas.

The gas inlet opening and the gas outlet opening may be the openings that are elongated in a direction perpendicular to a flowing direction of the treatment gas.

The opening area of the gas outlet opening may be greater than the opening area of the gas inlet opening.

The treatment gas may contain oxygen, and a concentration of oxygen may be equal to or greater than 50% in the treatment gas.

The distance between the object and the window member may be equal to or smaller than 1 mm.

Advantageous Effects of the Invention

The ashing apparatus of the present invention has the ultraviolet beam transmitting window member in the treatment chamber, in which the object to be treated is placed. Thus, it is possible to keep the positional relation between the window member and the surface of the object, with the distance between the window member and the surface of the object being small. In addition, the ashing apparatus (or the treatment chamber) includes a mechanism for allowing the gas to flow through the treatment chamber. Thus, it is possible to maintain the atmosphere around the object in a stable manner.

The flow passage for allowing the treatment gas to flow in a substantially fixed direction from one side to an opposite side of the surface to be treated is formed (established) above the surface to be treated of the object. Thus, the carbon dioxide gas generated upon irradiating the smear with the ultraviolet beam flows in the same direction as the treatment gas, and is discharged from the gas outlet opening. Because the ultraviolet beam from the ultraviolet lamp moves in the direction opposite the flowing direction of the treatment gas or the same direction as the flowing direction of the treatment gas, it is possible to irradiate the target surface (surface to be treated) with the ultraviolet beam while supplying the treatment gas to the target surface, even if the carbon dioxide gas is generated upon decomposing of the smear on the surface to be treated. Accordingly, the ultraviolet beam is not blocked (shielded) by the carbon dioxide gas, and the desmear processing can be carried out at a high efficiency.

BRIEF DESCRIPTION OF THE DRAWINGS

FIG. 5 is a cross-sectional view of an ashing apparatus according to another embodiment of the present invention.

DESCRIPTION OF EMBODIMENTS

Figure 1:
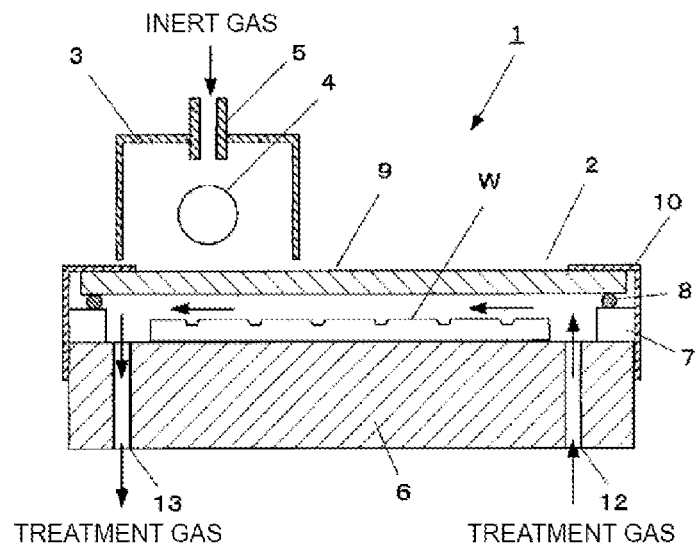
FIG. 1 is a cross-sectional view of an ashing apparatus according to an embodiment of the present invention.
Figure 2:
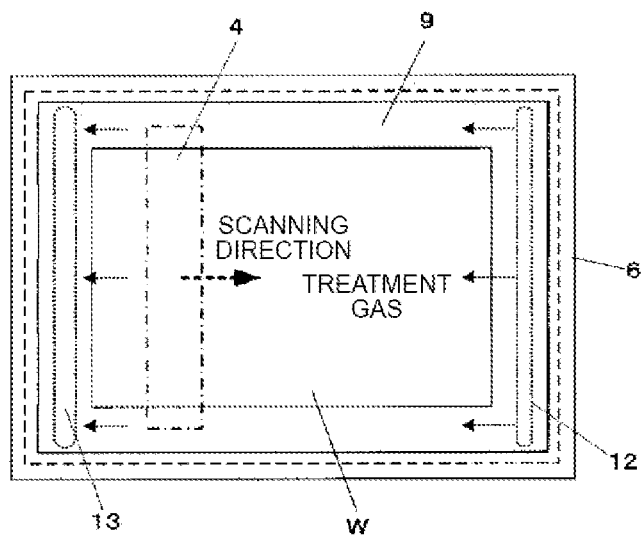
FIG. 2 is a top view of the ashing apparatus according to the embodiment of the present invention.

FIG. 1 is a cross-sectional view showing a configuration of an asher apparatus according to an embodiment of the present invention, and FIG. 2 is a top view thereof and only illustrates major parts of the ashing apparatus.

The ashing apparatus 1 of this embodiment includes a treatment chamber 2 configured to place an object to be treated W therein, and a lamp chamber 3 configured to house an ultraviolet lamp 4. The ultraviolet lamp 4 is used to irradiate the object W with an ultraviolet beam.

A stage 6 is disposed in the treatment chamber 2. The stage 6 is configured to put the object or work W thereon. A frame 7 extends along the edge of the stage 6. A window member 9 is disposed on the frame 7, with a sealing member 8 being interposed between the window member 9 and the frame 7. The window member 9 is made from, for example, a quartz glass, and has an ultraviolet transmitting property. The periphery of the window member 9 is covered with a covering element 10 for protection.

As shown in FIG. 2, the stage 6 has a gas inlet opening or port 12 for supplying (introducing) a treatment gas. The gas inlet opening 12 extends along one edge of the stage 6. The stage 6 also has a gas outlet opening or port 13 for discharging the treatment gas. The gas outlet opening 13 extends along an opposite edge of the stage 6. Thus, the treatment gas such as oxygen is supplied between the object W and the window member 9 in the treatment chamber 2 from the gas inlet opening 12 formed in the stage. The treatment gas is supplies from a lower area (from under the object) in a direction perpendicular to the surface to be treated of the object W. The treatment gas collides with the window member 9 and diffuses such that the flow of the treatment gas is moderated and the treatment gas has a uniform flow. The treatment gas flows along the surface of the object W toward the gas outlet opening 13 without having irregularities in its flow, and flows out of the chamber from the gas outlet opening 13.

As clearly shown in FIG. 2, the gas inlet opening 12 and the gas outlet opening 13 are openings that extend in directions perpendicular to the flowing direction of the treatment gas. This configuration allows the gas to uniformly flow along the surface of the object W.

An opening area (size) of the gas outlet opening 13 is greater than the opening area of the gas inlet opening 12. Thus, the treatment gas (processing gas) does not stay in the treatment chamber 2, but flows smoothly along the surface of the object W such that the treatment gas is discharged from the gas outlet opening 13.

It should be noted that the gas inlet opening 12 and the gas outlet opening 13 are not limited to the elongated holes as illustrated in the drawing. Each of the gas inlet opening 12 and the gas outlet opening 13 may have any suitable shape and configuration, such as a plurality of small openings or holes arranged (aligned) in a direction perpendicular to the flowing direction of the treatment gas.

The object W is, for example, a planar wiring substrate, and has an insulating layer on its surface. The object W also has openings (i.e., via holes) formed in the insulating layer. The smear S is present around (along) each opening. The smear S is made from the same substance as the insulating layer. The object W is placed on the stage 6 such that the smear S is exposed in the treatment space defined between the stage 6 and the window member 9.

Preferably, the distance between the surface of the object W and the inner face of the window member 9 has a fixed value that allows the gases (e.g., treatment gas and other gases such as a carbon dioxide gas generated after the treatment) to flow therethrough, and the maximum value of this distance is equal to or smaller than 3 mm in order to enhance the ozone treating (ashing) capability with the ultraviolet beam.

The treatment gas introduced into the treatment chamber 2 is a mixture gas that contains oxygen. Preferably, the mixture gas also includes, other than oxygen, those gases which do not affect the ultraviolet transmitting property. For example, an inert gas such as a nitrogen gas or a noble gas is contained in the mixture gas. Preferably, the treatment gas may contain oxygen 50% or more when the ashing treatment is applied to the wiring substrate. An ozone gas may also be contained in the mixture gas in order to enhance the ashing effect.

As described above, when the treatment gas that contains oxygen is supplied through the gas inlet opening 12 formed along one edge (right edge in FIGS. 1 and 2) from a lower area (from under the treatment chamber) in a direction perpendicular to the treatment chamber, the treatment gas collides with the window member 9 in the treatment chamber such that the flow of the treatment gas is moderated and the treatment gas has a uniform flow. Subsequently, the treatment gas flows along the surface of the object W in a fixed direction from the right to the left in the treatment space, without having irregularities in its flow. Then, the treatment gas flows out of the treatment space from the gas outlet opening 13 formed along the opposite edge (left edge in the drawings).

An ultraviolet lamp 4 is housed in the lamp chamber 3. The ultraviolet lamp 4 has a rod shape, and extends in a direction perpendicular to the flowing direction of the treatment gas. The lamp chamber 3 has an inert gas feeding pipe 5 to feed (introduce) the inert gas such as a nitrogen gas. Thus, the interior of the lamp chamber 3 is an inert gas atmosphere, and an area around the lamp 4 is an inert gas atmosphere.

The lamp chamber 3 is disposed above the treatment chamber 2, with minute spacing being left between the window member 9 and the lamp chamber 3. In this embodiment, the lamp chamber 3 is moved for scanning, relative to the treatment chamber 2, in parallel to the flowing direction of the treatment gas. Specifically, the lamp chamber 3 is moved for scanning, in a direction opposite the flowing direction of the treatment gas.

The lamp 4, which serves as the ultraviolet light source and is located in the lamp chamber 3, emits a vacuum ultraviolet beam (ultraviolet beam at a wavelength of 200 nm or an even shorter wavelength). Various known kinds of lamps may be used as the lamp 4. For example, a xenon excimer lamp that has a xenon gas sealed therein and emits light at wavelength of 172 nm may be used as the lamp 4, or a low pressure mercury lamp which emits light at a wavelength of 185 nm may be used as the lamp 4. In particular, the xenon excimer lamp is preferred when it is used as the lamp in the above-described type of ashing apparatus.

Figure 3:
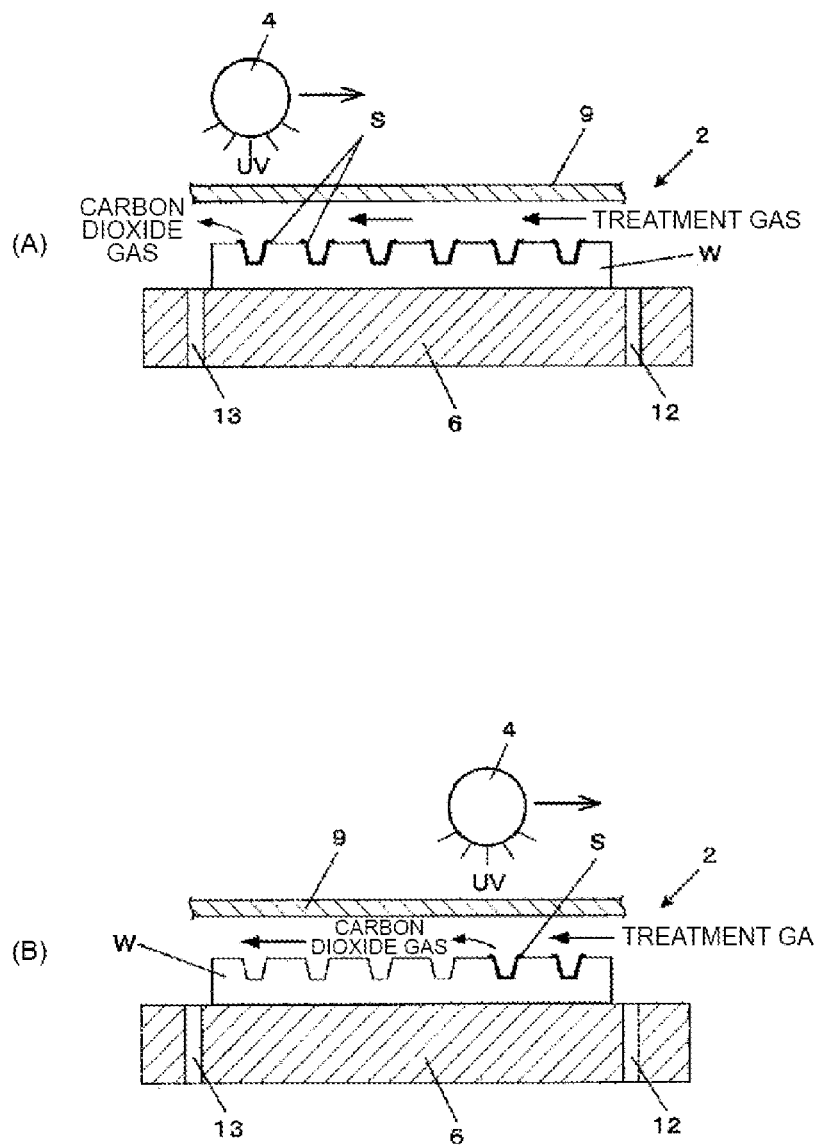
FIG. 3(A) and FIG. 3(B) are views useful to describe an exemplary treatment process according to the embodiment of the present invention.

The ashing treatment (processing) performed by the above-described configuration is schematically illustrated in FIGS. 3(A) and 3(B).

As shown in FIGS. 3(A) and 3(B), the object to be treated W, which has the remaining smear S, is placed in the treatment chamber 2 such that the object W is spaced from the window member 8 at a predetermined distance.

(A) Referring to FIG. 3(A), the treatment gas introduced from the gas inlet opening 12 flows from one side (gas inlet opening 12) to the other side (gas outlet opening 13) in the treatment chamber. The lamp 4 for emitting an ultraviolet (UV) beam is turned on and moved over the object W in a direction opposite the flowing direction of the treatment gas such that the lamp 4 irradiates the object W with an ultraviolet beam. The lamp 4 may continuously emit the ultraviolet beam, or intermittently emit the ultraviolet beam. The relative movement between the lamp 4 and the object W may be continuous or may be discontinuous.

The smear S is irradiated with the ultraviolet beam when the smear S is positioned immediately below the lamp 4 (or in its vicinity). Thus, the smear is decomposed. The constituent of the smear is derived from the insulating layer, which is originally included in the wiring substrate. The major constituent of the smear may include an epoxy resin, a bismaleimide triazine resin or other thermosetting resin. The insulating layer may contain an inorganic insulating filler (e.g., silica) which is dispersed in the insulating layer. The smear is oxidized with a reactive oxygen and/or ozone, which is generated upon irradiation of the ultraviolet beam in the treatment chamber. Then, the oxidized smear is decomposed to a gas, such as carbon dioxide gas or moisture (water), on the basis of the composition of the material(s) of the insulating layer. The resulting gas is released in the treatment space, and moved along the flow of the treatment gas such that the resulting gas is discharged from the gas outlet opening 13.

(B) Referring to FIG. 3(B), as the ultraviolet lamp 4 moves, the ultraviolet beam is emitted to the smear S that is present immediately below the ultraviolet lamp 4 (or in its vicinity). As a result, the smear is decomposed, and removed from the substrate. As such, the desmear process is carried out in an atmosphere of a fresh treatment gas supplied from the gas inlet opening 12 while the treatment gas is always flowing to remove (sweep) the carbon dioxide gas and other gases. Accordingly, the ultraviolet beam is not absorbed by the carbon dioxide gas, and reaches the treatment gas and the work or object to be treated W. It is, therefore, possible to efficiently irradiate the smear with the ultraviolet beam and efficiently remove the smear. The ultraviolet beam is not emitted excessively, and it is possible to avoid an undesired decomposition of the insulating layer.

Figure 4:
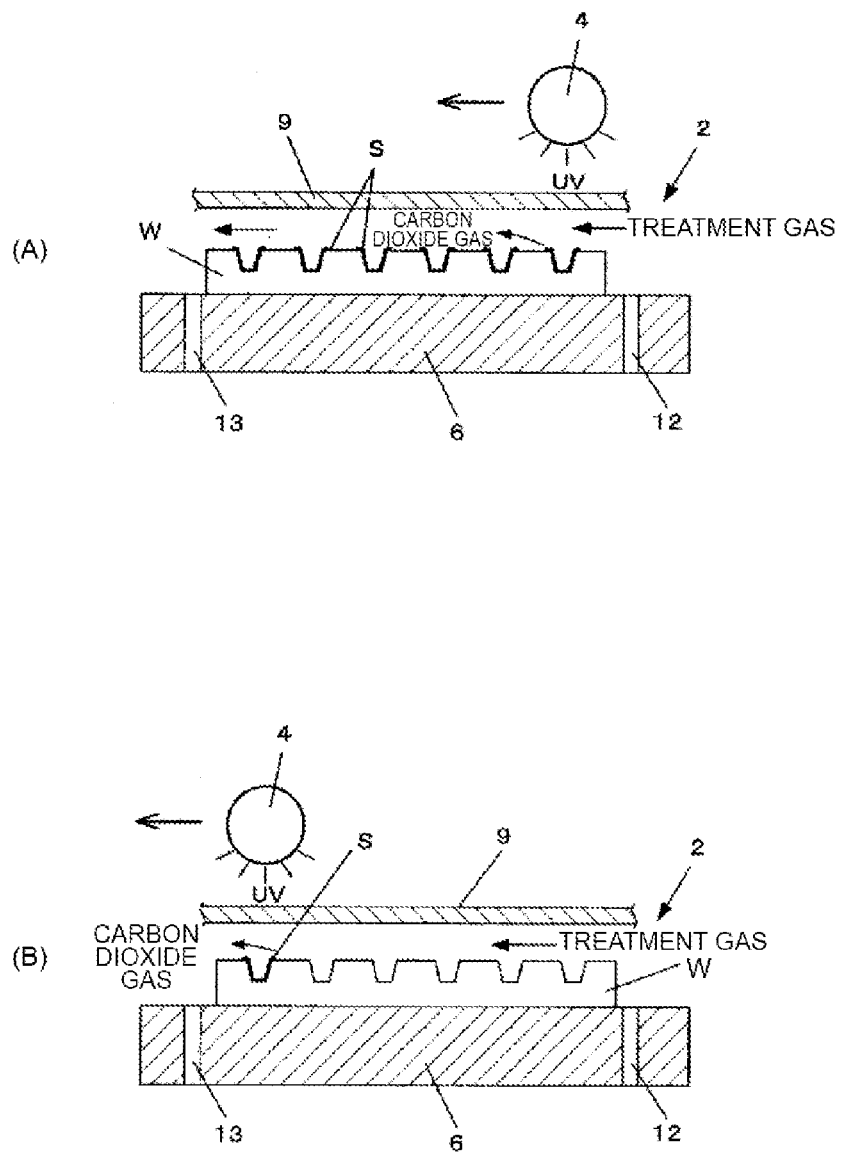
FIG. 4(A) and FIG. 4(B) are views useful to describe another example of the treatment process according to one embodiment of the present invention.
Figure 6A:
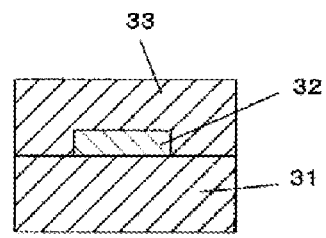
FIG. 6(A), FIG. 6(B) and FIG. 6(C) are views useful to describe an exemplary method of manufacturing a multi-layer wiring substrate.
Figure 6B:
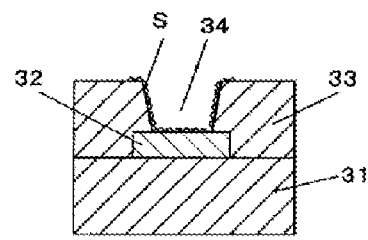
Figure 6C:
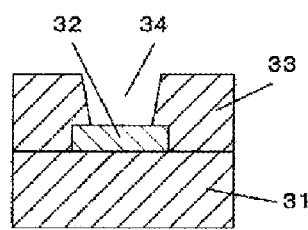

FIGS. 4(A) and 4(B) show another embodiment. In this embodiment, the scanning direction (moving direction) of the ultraviolet lamp 4 is the same as the flowing direction of the treatment gas.

In this configuration, the speed of the movement of the lamp 4 relative to the treatment chamber 2 (object W) is slower than the flowing speed of the treatment gas.

(A) Referring to FIG. 4(A), the treatment gas introduced from the gas inlet opening 12 flows from one side (gas inlet opening 12) to the opposite side (gas outlet opening 13) in the treatment chamber. The lamp 4 for emitting the ultraviolet (UV) beam moves in the same direction as the gas that flows above (along) the object W, while the lamp 4 is emitting the light. Thus, the object W is irradiated with the ultraviolet beam.

In the treatment chamber, the smear reacts with a reactive oxygen and/or ozone, which is generated when the oxygen gas contained in the treatment gas is irradiated with the ultraviolet beam and reacts with the ultraviolet beam. Then, the smear S is decomposed to a gas, such as carbon dioxide gas or moisture (water). As the resulting gas is released in the treatment space, it moves along the flow of the treatment gas such that the resulting gas is discharged from the gas outlet opening 13.

(B) Referring to FIG. 4(B), as the ultraviolet lamp 4 moves, the ultraviolet beam is emitted to the smear S that is present immediately below the ultraviolet lamp 4 (or in its vicinity). As a result, the smear is decomposed, and removed from the substrate. Because the flowing speed of the treatment gas is faster than the moving speed of the lamp 4, the carbon dioxide gas which is generated from the smear is conveyed to the gas outlet opening 13 by the flowing treatment gas before the lamp 4 reaches the gas outlet opening. In other words, the lamp 4 moves above (along) the object W while following the treatment gas. Thus, the object W is irradiated with the ultraviolet beam without the generated carbon dioxide gas.

Thus, the desmear process is carried out in an atmosphere of a fresh treatment gas supplied from the gas inlet opening 12 while the treatment gas is always flowing to remove (sweep) the generated carbon dioxide gas and other gases. Accordingly, the ultraviolet beam is not absorbed by the carbon dioxide gas, and reaches the treatment gas and the object to be treated W.

It should be noted that although the lamp 4 is moved in the above-described embodiments, the treatment chamber 2 (i.e., the object to be treated W) may be moved. When the treatment chamber is moved, the window member 9 and the object W, which are provided in the treatment chamber 2, are moved together or simultaneously. Thus, it is possible to keep the distance between the window member 9 and the object W to a fixed value while the window member 9 and the object W being moved. Therefore, the lamp 4 does not collide with the object W during the scanning process, and the illuminance of the ultraviolet beam directed to the object W does not alter.

Furthermore, because the scanning direction is parallel to the flowing direction of the treatment gas, it is possible to remove the decomposition gas such as carbon dioxide gas, which is generated upon decomposition of the smear, together with the flowing treatment gas. The decomposition gas is removed from the location where the decomposition gas is generated. Accordingly, the transmissivity of the ultraviolet beam directed to that part of the object which is irradiated with the ultraviolet beam from the lamp does not change locally. Thus, it is possible to irradiate the object with the ultraviolet beam at a fixed illuminance, and efficiently carry out the treatment (processing) to the object.

When the object W has a large size, e.g., when the size of the object W is equal to or greater than 500 mm×500 mm, it is likely, in particular, that the surface of the object is not processed uniformly. The present invention is particularly useful when such a large object is processed (treated).

An example having specific numeric values will be described below. When the size of the object W is 500 mm×500 mm, then the size of the treatment gas inlet opening 12 is about 3 mm×600 mm, and the size of the treatment gas outlet opening 13 is about 10 mm×600 mm. In this specific example, each of the gas inlet opening 12 and the gas outlet opening 13 has a slit shape or an elongated shape. It should be noted that the present invention is not limited to such configuration, as mentioned above.

As understood from the foregoing, it is preferred that the total opening area of the gas outlet opening 13 is greater than the total opening area of the gas inlet opening 12. When the gas outlet opening is larger than the gas inlet opening, the gas does not stay or the flow of the gas is not decelerated in the treatment chamber. Then, it is possible to ensure (create) a uniform flow of the gas in the fixed direction from the gas inlet opening 12 to the gas outlet opening 13. It is possible to maintain a stable flow of the gas.

In the treatment process applied to the wiring substrate, it is preferred that oxygen has a high concentration, in order to treat the smear in a short time and avoid the influence on other part of the wiring substrate (insulating layer). In particular, when the concentration of oxygen is equal to or higher than 50%, it is possible for the reactive oxygen to have a very high concentration, and the process can be carried out in a preferred manner.

The distance between the object W and the window member 9 is preferably equal to or smaller than 3 mm, and more preferably equal to or smaller than 1 mm. When the spacing between the window member 9 and the object W is set to be small as described above, part of the ultraviolet beam from the lamp 4 directly reaches the surface of the object W. This further enhances the processing (treating) capability. When the oxygen concentration in the treatment space is maintained to be high (i.e., equal to or higher than 50%), then the ultraviolet beam is absorbed by oxygen before the ultraviolet beam reaches the surface of the object W if the distance between the object W and the window member 8 exceeds a predetermined distance. By setting the distance between the object W and the window member to be small, however, it is possible to delimit the area, where the reactive oxygen is generated, to the vicinity of the surface of the object W, and also possible to directly irradiate the object W with part of the ultraviolet beam while maintaining the transmissivity of the ultraviolet beam.

FIG. 5 shows still another embodiment of the present invention. In this embodiment, the lamp chamber is modified to a closed structure.

As illustrated in FIG. 5, the lamp chamber 3 has a closed housing 15 that houses the lamp 4 and has walls in all directions. The lamp chamber 3 also has an ultraviolet transmitting window 16 in that wall which faces the treatment chamber 2. The light from the ultraviolet lamp 4 disposed in the lamp chamber 3 is emitted outward through the transmitting window 16.

A mechanism for feeding a nitrogen gas or other inert gas is connected or attached to the lamp chamber 3 for the purpose of preventing the ultraviolet beam from being absorbed and/or attenuated in the lamp chamber 3. For example, an inert gas feed pipe 17 is attached to an upper portion of the housing 15, and the inert gas is expelled from an outlet pipe 18 attached to a side wall of the housing. Also, a blow pipe 19 is attached along the lamp chamber 3 for feeding a nitrogen gas or other inert gas. This suppresses the attenuation of the ultraviolet beam emitted from the lamp chamber 3 while the ultraviolet beam is travelling from the lamp chamber 3 to the treatment chamber 2.

At least one of the treatment chamber 3 and the lamp chamber 4 is moved by a movement mechanism (not shown) such that the treatment chamber 3 and the lamp chamber 4 can move relative to each other. One of the treatment chamber 3 and the lamp chamber 4 (or both of the treatment chamber 3 and the lamp chamber 4) are moved while the lamp is emitting the light. Other configurations of this embodiment are the same as those of the embodiment shown in FIGS. 1 and 2.

As described above, the window member of the present invention that defines the treatment chamber and the lamp chamber is secured to the treatment chamber. The window member has an ultraviolet transmitting property, and the object to be treated is housed in the treatment chamber. Thus, it is possible to fixedly maintain the positional relation between the window member and the surface of the object to be treated, with a small clearance being left between the window member and the surface of the object to be treated. In addition, the ashing apparatus has the mechanism for causing the treatment gas, which is introduced into the treatment chamber from the gas inlet opening formed in the stage, to flow uniformly or without having irregularities in its flow along the surface to be treated. Thus, the atmosphere around the object to be treated is maintained in a stable condition.

The flow passage is established such that the treatment gas in the treatment chamber flows in the fixed direction from one side to the opposite side of the surface to be treated of the object. The carbon dioxide gas, which is generated upon irradiating the smear with the ultraviolet beam, flows in parallel to the flowing direction of the treatment gas and is discharged from the gas outlet opening. The lamp is scanned (moved) in parallel to the flowing direction of the treatment gas. Thus, even if the carbon dioxide gas is generated upon decomposing of the smear on the surface to be treated, the carbon dioxide gas is removed from the irradiation area by the treatment gas, and therefore it is possible to emit the ultraviolet beam to the irradiation area while the treatment gas is always being supplied. Accordingly, the ultraviolet beam is not blocked by the carbon dioxide gas, and the desmear processing can be carried out at a high efficiency.

The above-described technique (method and apparatus) may be utilized in a process of ashing a resist, which is used in a process of manufacturing a semiconductor, a liquid crystal substrate, a flexible substrate or the like, and also be utilized in a method and an apparatus for removing a residue of the resist or the like.

REFERENCE NUMERALS AND SYMBOLS

1: Ashing apparatus
2: Treatment chamber
3: Lamp chamber
4: Lamp
5: Inert gas feed pipe
6: Stage
7: Frame
9: (Ultraviolet transmitting) Window member
10: Cover
12: (Treatment gas) Inlet opening
13: (Treatment gas) Outlet opening
15: (Lamp chamber) Housing
16: Ultraviolet transmitting window
17: (Inert gas) Feed pipe 18: (Inert gas) Exhaust pipe
19: (Inert gas) Blow pipe
W: Work or object to be treated

The invention claimed is:

1. An ashing apparatus comprising:
a treatment chamber configured to place an object to be treated therein;
a lamp chamber having an ultraviolet lamp, the ultraviolet lamp being configured to irradiate the object with an ultraviolet beam, the treatment chamber and the lamp chamber being moved relative to each other and in parallel to a surface to be treated of the object, the treatment chamber having a stage to support the object, a gas inlet opening formed in the stage to supply a treatment gas into the treatment chamber in a direction perpendicular to the surface to be treated, and a gas outlet opening formed in the stage to discharge the treatment gas from the treatment chamber in the direction perpendicular to the surface to be treated; and
a window member configured to transmit the ultraviolet beam therethrough, and secured to the treatment chamber, the window member being configured to partition the treatment chamber and the lamp chamber from each other, the lamp chamber and the treatment chamber being moved relative to each other in parallel to a flowing direction of the treatment gas in the treatment chamber while the treatment gas is flowing from the gas inlet opening to the gas outlet opening and the ultraviolet lamp is emitting the ultraviolet beam.

2. The ashing apparatus according to claim 1, wherein the lamp chamber and the treatment chamber are moved relative to each other in a direction opposite the flowing direction of the treatment gas in the treatment chamber.

3. The ashing apparatus according to claim 1, wherein the lamp chamber and the treatment chamber are moved relative to each other in a same direction as the flowing direction of the treatment gas in the treatment chamber, and a speed of a relative movement between the lamp chamber and the treatment chamber is slower than a flowing speed of the treatment gas.

4. The ashing apparatus according to claim 1, wherein the gas inlet opening and the gas outlet opening extend in a direction perpendicular to the flowing direction of the treatment gas.

5. The ashing apparatus according to claim 4, wherein an opening area of the gas outlet opening is greater than an opening area of the gas inlet opening.

6. The ashing apparatus according to claim 1, wherein the treatment gas contains oxygen, and a concentration of oxygen is equal to or greater than 50%.

7. The ashing apparatus according to claim 1, wherein a distance between the object and the window member is equal to or smaller than 1 mm.

* * * * *